United States Patent [19]
Hattori et al.

[11] Patent Number: 5,403,616
[45] Date of Patent: Apr. 4, 1995

[54] METHOD FOR FORMING PATTERNED TRANSPARENT CONDUCTING FILM

[75] Inventors: Akiyoshi Hattori, Moriguchi; Yoshihiro Hori; Akihiko Yoshida, both of Hirakata, all of Japan

[73] Assignee: Matsushita Electric Industrial Co., Ltd., Osaka, Japan

[21] Appl. No.: 254,664

[22] Filed: Jun. 6, 1994

Related U.S. Application Data

[63] Continuation of Ser. No. 32,052, Mar. 16, 1993, abandoned.

[30] Foreign Application Priority Data

Oct. 27, 1992 [JP] Japan .................. 4-289069

[51] Int. Cl.$^6$ ............................................. B05D 5/12
[52] U.S. Cl. .................. 427/126.3; 427/226; 427/259; 427/282; 427/287; 427/553; 427/558; 427/559
[58] Field of Search .............. 427/126.3, 226, 259, 427/282, 287, 553, 558, 559, 386

[56] References Cited
U.S. PATENT DOCUMENTS

| | | | |
|---|---|---|---|
| 4,187,340 | 2/1980 | Oishi et al. | 427/259 |
| 4,420,500 | 12/1983 | Nakatani et al. | 427/108 |
| 4,789,620 | 12/1988 | Sasaki et al. | 430/280 |
| 4,924,800 | 12/1990 | Tanaka | 118/50.1 |

FOREIGN PATENT DOCUMENTS

| | | |
|---|---|---|
| 0050415A1 | 4/1982 | European Pat. Off. . |
| 0106628A1 | 4/1984 | European Pat. Off. . |
| 0395411A2 | 10/1990 | European Pat. Off. . |
| 2371241 | 6/1978 | France . |
| 2068834 | 8/1981 | United Kingdom . |

*Primary Examiner*—Shrive Beck
*Assistant Examiner*—David M. Maiorana
*Attorney, Agent, or Firm*—Stevens, Davis, Miller & Mosher

[57] ABSTRACT

Printing is conducted at the transparent conducting film unnecessary portion on a substrate 1 with a masking ink having a higher thermal decomposition temperature than that of the transparent conducting film forming composition, and the ink is dried and cured by heat or light to form a masking pattern 2. The portion where a transparent conducting film is to be formed is preferably subjected to ozone cleaning and then coated with a transparent conducting film forming composition comprising an indium compound and/or a tin compound and a solvent to form a transparent conducting film forming composition layer 3. The thus worked substrate is subjected to a heat treatment, causing thermal decomposition of the masking pattern 2 after formation of a transparent conducting film. Then the residues of the masking ink and the transparent conducting film are removed to finally obtain a desired patterned transparent conducting film 4.

15 Claims, 2 Drawing Sheets

 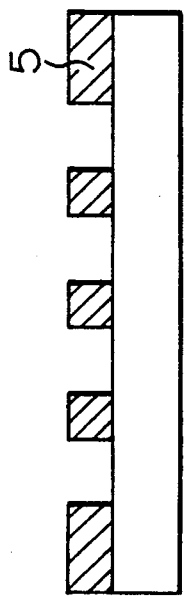 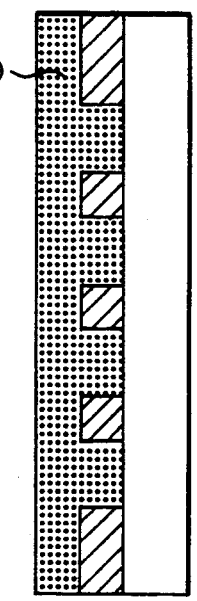 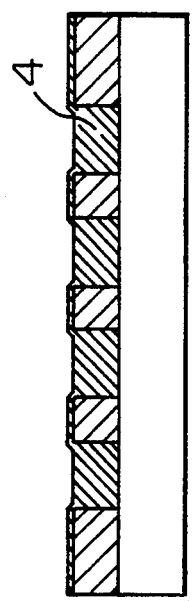 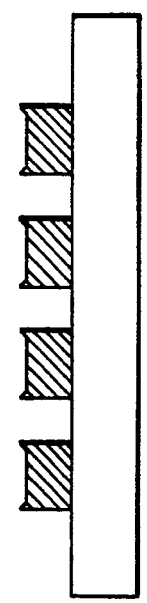
 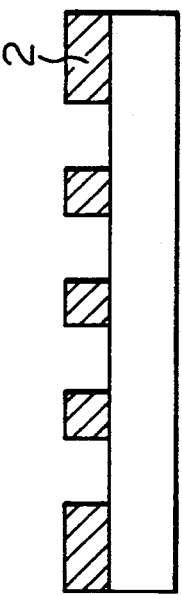 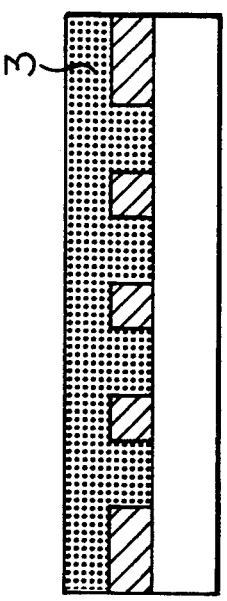 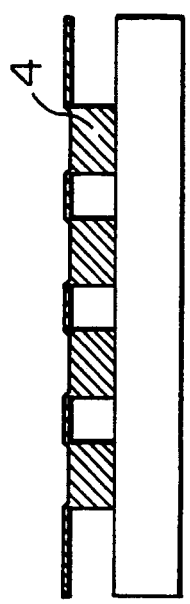 

METHOD FOR FORMING PATTERNED TRANSPARENT CONDUCTING FILM

This application is a continuation of application Ser. No. 08/032,052, filed Mar. 16, 1993, (abandoned).

BACKGROUND OF THE INVENTION

This invention relates to a transparent conducting film formed on a substrate such as glass, ceramic, etc., which film is used as a heating element for preventing surface clouding (moisture collecting) or frosting of the electrodes of display devices such as liquid crystal displays (LCD), electroluminescent displays (EL), etc., and the windowpanes of automobiles, aircraft, buildings, etc. Especially, the invention relates to a method for forming said type of patterned transparent conducting film.

Hitherto, electrode materials having high visible light transmittance have been used for the heat-generating resistance element for preventing surface clouding or frosting of the electrodes of display devices such as LCD, EL, etc., and the windowpanes of automobiles, aircraft, buildings, etc.

Tin oxide/antimony oxide system (ATO), indium oxide/tin oxide system (ITO), etc., are known as typical examples of the transparent conductive materials usable for forming said transparent conducting film. These metal oxides are capable of easily forming a coating film on a glass or ceramic substrate to provide a transparent conducting film.

The following techniques are known for forming a transparent conducting film:

(1) vacuum deposition;
(2) sputtering
(3) CVD;
(4) printing;
(5) coating (dip coating, spin coating and roll coating).

However, methods (1), (2) and (3) mentioned above, in which usually a pattern is formed by photolithography, have problems such an extra number of steps for pattern formation and generation of waste liquid in the course of etching. For solving these problems, it has been contrived to perform patterning by a lift-off method. Nevertheless, because of the structural complexity and high cost of the film forming apparatus, there has not yet been reached any satisfactory solution to the essential problems of production cost and productivity. On the other hand, methods (4) and (5), although having the possibility to resolve said problems in methods (1) to (3), had a problem in that it is difficult with these methods to form a film which can well stand practical use.

For example, concerning method (4), when screen printing is performed with a paste-like composition containing light-curing tin and indium salts of the organic acids having a functional group or a composition made of an inorganic indium salt, an inorganic tin salt, a non-aqueous silica sol and an organic solution of a cellulose compound, or when offset printing is conducted with a composition comprising an indium compound, a tin compound, a gum type resinous rosin and a terpene type high-boiling solvent, there arise typically the following two problems.

The first problem is that the film thickness at the 'solid' portion tends to vary greatly while the film thickness at the pattern end becomes small, both of which are destined to occur in screen printing and offset printing. Another problem is that the cellulose compound and the resin such as gum type natural resinous rosin contained in the composition for obtaining good printability tend to remain in the form of free carbon in the film after thermal decomposition, making unavoidable the deterioration of the electrical, optical and mechanical properties of the film.

In the case of method (5), since no high-molecular weight compound able to produce free carbons is contained in the transparent conducting film forming composition, printing of a low-viscosity composition is hardly possible. Further, with spin or dip coating, it is difficult to perform direct pattern formation in the film forming process, and pinholes tend to form in the film due to insufficient cleaning or the presence of oil films.

SUMMARY OF THE INVENTION

The present invention has for its object to eliminate said prior art problems and to provide a method for forming a patterned transparent conducting film, according to which method it is possible to obtain a patterned transparent conducting film having high transmittance and low resistance by a simple process at low cost.

The present invention provides a method for forming a patterned transparent conducting film comprising the steps of:

conducting printing at a transparent conducting film unnecessary portion on a substrate with a masking ink having a higher thermal decomposition temperature than that of a transparent conducting film forming composition;

curing said masking ink by heat or light;

if necessary, subjecting the thus treated substrate to ozone cleaning;

coating the transparent conducting film forming composition on said substrate;

subjecting this substrate to a heat treatment; and removing residues of said masking ink and transparent conducting film.

BRIEF DESCRIPTION OF THE DRAWINGS

FIGS. 1A, 1B, 1C, 1D and 1E are schematic sectional views illustrating the process of forming a patterned transparent conducting film as an embodiment of the resent invention.

FIGS. 2A, 2B, 2C, 2D and 2E are schematic sectional views illustrating the process of forming a patterned transparent conducting film as another embodiment of the present invention.

DESCRIPTION OF THE PREFERRED EMBODIMENTS

Figure 3:
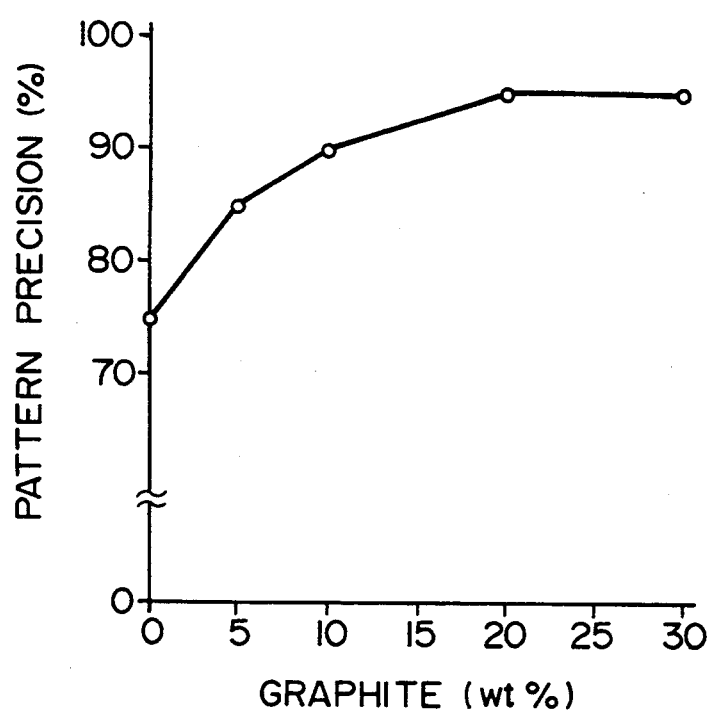
FIG. 3 is a graph showing the relationship between graphite powder content in the masking ink and pattern precision of the masking pattern.

According to the method for forming a patterned transparent conducting film of this invention, the masking ink is printed on transparent conducting film unnecessary portions on a substrate, said masking ink having a higher thermal decomposition temperature than that of a transparent conducting film forming composition, and after drying, said masking ink is cured by heat or light to form a masking pattern. The portions of the substrate where the transparent conducting film is to be formed are, if necessary, cleaned with ozone. Said portions are, then coated with a transparent conducting film forming composition having preferably a thermal decomposition temperature of 450° C. or lower, more preferably 100° C. to 400° C., and comprising an indium compound and/or a tin compound and a solvent to form a transparent conducting film forming composition layer. The thus coated substrate is then subjected to a heat treatment, causing thermal decomposition of said masking pattern after formation of the transparent conducting film. Then the residues of said masking ink and transparent conducting film are removed to finally obtain a patterned transparent conducting film.

The masking ink cured by heat or light (usually ultraviolet light of long wavelength) has sufficient heat resistance up to a temperature at which the transparent conducting film forming composition is -thermally decomposed to form a transparent conducting film. Also, the whole or part of the masking ink is thermally decomposed at a temperature below the heat treatment temperature allowing easy removal of the residues of the masking ink and transparent conducting film. It is to be further noted that the pattern of the transparent conducting film to be formed depends on the masking ink printed pattern, so that in coating with a transparent conducting film forming composition, it is possible to give undivided attention to uniform coating on the substrate, leading to the solution of the prior art problem of non-uniformity of transparent conducting film thickness.

When the masking ink is cured by irradiation with UV light (e.g. 365 nm), the light amount is preferably 100 mJ/cm$^2$ or more, more preferably 500 to 3000 mJ/cm$^2$. The irradiation with UV light can be carried out by a continuous method (using a conveyer) or a batch method.

The thermal decomposition temperature of the masking ink should be higher than that of the transparent conducting film forming composition and is preferably 150° to 450° C.

After the masking ink has been cured by heat or light, oil films are formed at the substrate-bared areas of the transparent conducting film formed portion, but such oil films on the substrate are removed by ozone generated by ultraviolet-light irradiation, so that the problem of formation of pinholes in the conventional methods can be solved.

According to the present invention, as described above, printing is performed at the conducting film unnecessary portion on the substrate with a masking ink, after drying, the ink is cured by heat preferably at 50° to 200° C. more preferably 100° to 150° C., for 4 to 60 minutes, or light to improve solvent resistance of the masking pattern. In case curing is accomplished by using ultraviolet light, the oil films formed at other portions on the substrate than the masking pattern can be removed by oxidative destruction with ozone generated by ultraviolet light of short wavelength, which takes place concurrently with curing by ultraviolet light of long wavelength. Removal of the oil films by this ozone cleaning leads to a remarkable improvement of coating properties of the transparent conducting film forming composition and a salient decrease of pinholes.

The ozone cleaning can be carried out by a conventional method using a low-pressure or high-pressure mercury lamp (e.g. about 185 nm, 254 nm, etc.) with preferably 100 to 1000 W for 20 seconds to 20 minutes using a continuous (conveyer) method or batch method.

The masking ink used in this invention contains at least a heat- or light-curing compound having a functional group. It is possible to use any compound which, after cured, becomes a substance having a higher thermal decomposition temperature than that of the transparent conducting film forming composition. Epoxy (meth)acrylate and urethane (meth)acrylate are preferred examples of such compounds. The masking ink comprises preferably 40 to 99.9% by weight,-more preferably 50 to 99% by weight, of urethane (meth)acrylate or epoxy (meth)acrylate, preferably 0.1 to 10% by weight, more preferably 0.5 to 2% by weight of a curing initiator, and preferably 0 to 50% by weight, more preferably 0.5 to 50% by weight of a solvent. Use of a masking ink containing carbon powder improves pattern precision and solvent resistance of the masking pattern, allowing suppression of the reaction with the transparent conducting film forming composition at the time of thermal decomposition. Also, since there takes place no reaction with the substrate, removal of the residues of the masking ink and transparent conducting film becomes easier than when using a masking ink containing an oxide powder. The carbon powder content in the masking ink is preferably not greater than 30 wt % because when it exceeds 30 wt %, the ink may become incapable of printing. As carbon powder, it is recommended to use graphite (natural or synthetic), carbon black or acetylene black. As amorphous carbon powder, activated carbon is preferably used.

The residues of said masking ink and transparent conducting film need to be removed by physical means. It is preferably effected by ultrasonic cleaning in water or an organic solvent such as acetone, ethanol, propanol, etc. with a power of 10 to 1200 W, and 4 to 600 kHz, for 10 seconds to 60 minutes or by blowing of high-pressure gas (e.g. $N_2$ or inert gas with a pressure of 0.5 to 10 kg/cm$^2$, preferably 1 to 2 kg/cm$^2$).

As means for forming the masking pattern, it is preferred, in terms of productivity and cost, to employ a method in which a desired pattern is directly formed from the resin film of a negative pattern by screen printing or offset printing.

When a transparent conducting film forming composition comprising an indium compound and/or a tin compound and a solvent is coated on a substrate and subjected to a heat treatment, there takes place thermal decomposition of the organic matter in the masking ink after formation of a transparent conducting film, and a thin layer of transparent conducting film remains on the masking ink. The transparent conducting film forming composition used here is preferably free of any high-molecular weight compound and preferably comprises 0.1 to 30% by weight, more preferably 1 to 15% by weight of indium and/or tin compounds, and 70 to 99.9% by weight, more preferably 85 to 99% by weight, of a solvent. Various coating methods such as roll coating, dip coating, spin coating, etc., can be employed for coating of the transparent conducting film forming composition, but dip coating or spin coating is preferred. The calcining temperature may be selected from the range above the temperature at which the transparent conducting film forming composition and the cured masking ink are decomposed and below the substrate deforming temperature. It is preferably 400°–800° C.

In the present invention, screen printing or offset printing is used for forming the resin film of the negative pattern, but since dip coating or spin coating is employed for coating of the transparent conducting film forming composition, variation in thickness of the solid portion of the formed transparent conducting film is minimized, and also the film thickness at the pattern end portion is substantially equalized to the film thickness of the solid portion. Further, since the transparent conducting film forming composition is free of any high-molecular weight compound which tends to remain as free carbon after thermal decomposition, the obtained transparent conducting film has good properties.

The present invention will hereinafter be described more particularly with reference to Examples, which are merely intended to be illustrative and not to be construed as limiting the scope of the invention.

EXAMPLE 1

As illustrated in FIG. 1, screen printing was carried out on a silica coated sheet glass substrate 1 with a heat-curing masking ink composed of an epoxy type acrylate, an organic curing initiator and an organic solvent to print a pattern with a line width of 2 mm and a line spacing of 0.5 mm. After drying at 60° C. for 10 minutes, the printed pattern was heat treated at 130° C. for 20 minutes to cure the ink, forming a masking pattern 2. The masking pattern was subjected to ozone cleaning. The situation at this point is shown in FIG. 1B.

The 45 g of indium nitrate ($In(NO_3)_3 \cdot 3H_2O$) was weighed and put into a 1-liter Erlenmeyer flask, followed by addition of 50 g of acetylacetone and mixing and dissolution at room temperature. To this solution, 2.7 g (9 mol % as calculated from $Sn/(In+Sn) \times 100$) of stannous oxalate ($SNC_2O_4$) and acetone were added, followed by refluxing. The refluxed solution was cooled close to room temperature, added with 10 g of glycerin and stirred for mixing up to obtain a desired transparent conducting film forming composition. This composition was spin coated on said substrate to form a transparent conducting film forming composition layer 3. The situation at this stage of the process is shown in FIG. 1C.

The thus treated substrate was left at room temperature for 5 minutes, then dried at 100° C. for 5 minutes and calcined at 500° C. for one hour in oxygen. This situation is shown in FIG. 1D. The vacancies shown in the Figure are hollows generated as a consequence of formation of the transparent conducting film and thermal decomposition of the masking ink after curing. Lastly, nitrogen gas (gas pressure 1 kg/cm$^2$) was blown to remove the residues of the masking ink and the transparent conducting film to obtain a patterned transparent conducting film 4 of this invention. The final situation of the process is shown in FIG. 1E.

EXAMPLE 2

A pattern was formed on a silica coated sheet glass substrate 1 by screen printing with an ultraviolet-curing masking ink composed of an urethane type acrylate, an organic cure initiator and an organic solvent, and the printed pattern was dried at 90° C. for 10 minutes and then exposed to light from an ozoneless type high pressure mercury arc lamp to cure the ink. Other treatments were the same as in Example 1.

EXAMPLE 3

The procedure of Example 1 was repeated except that the transparent conducting film forming composition was dip coated instead of spin coating.

EXAMPLE 4

A pattern with a line width of 2 mm and a line spacing of 0.5 mm was formed on a silica coated sheet glass substrate 1 by screen printing with an ultraviolet-curing masking ink using an urethane type acrylate. The printed pattern was dried at 60° C. for 10 minutes and then exposed to an ozone type high pressure mercury arc lamp to cure the ink concurrently with ozone cleaning. The high pressure mercury arc lamp used in this Example is the one which is capable of generating ultraviolet rays over a wide range of wavelength (from long wavelength to short wavelength) and enables simultaneous accomplishment of curing of the masking ink and removal of the oil films formed by the ozone gas. Other treatments are the same as in Example 1.

EXAMPLE 5

The procedure of Example 4 was repeated except that an epoxy type acrylate was used instead of an urethane type.

EXAMPLE 6

The procedure of Example 4 was repeated except that the transparent conducting film forming composition layer 3 was formed by dip coating instead of spin coating.

COMPARATIVE EXAMPLE 1

45 g of indium nitrate ($In(NO_3)_3 \cdot 3H_2O$) and 5.4 g (9 mol % as calculated from $Sn/(In+Sn) \times 100$) of stannous chloride ($SnCl_4 \cdot 5H_2O$) were weighed and supplied into a 1-liter Erlenmeyer flask, followed by addition of α-terpineol and nitrocellulose. The supplied materials were mixed up by stirring to prepare a transparent conducting film forming composition. This transparent conducting film forming composition was screen printed on a silica coated sheet glass substrate to form a pattern with a line width of 2 mm and a spacing of 0.5 mm. The thus treated substrate was left at room temperature for 5 minutes, dried at 100° C. for 10 minutes and calcined at 500° C. for one hour to obtain a patterned transparent conducting film.

EXAMPLE 7

A pattern was formed on a silica coated sheet glass substrate 1 with an ultraviolet-curing masking ink, and the printed pattern was dried at 60° C. for 10 minutes and irradiated with light from an ozoneless type high pressure mercury lamp to cure the ink, thereby forming a masking pattern 2. Other treatments were the same as in Example 5.

The results of Examples 1–7 and Comparative Example 1 are shown in Table 1.

TABLE 1

|  | Film thickness (μm) | Sheet resistance (Ω/□) | Transmittance (%) at 550 nm | Pattern precision | Pinhole cissing |
| --- | --- | --- | --- | --- | --- |
| Example 1 | 0.054 ± 0.002 | 480 | 86 | Good | None |
| Example 2 | 0.048 ± 0.002 | 520 | 88 | Good | None |
| Example 3 | 0.051 ± 0.002 | 500 | 87 | Good | None |
| Example 4 | 0.049 ± 0.002 | 510 | 88 | Good | None |
| Example 5 | 0.053 ± 0.002 | 490 | 86 | Good | None |
| Example 6 | 0.052 ± 0.002 | 500 | 87 | Good | None |
| Comp. Example 1 | 0.050 ± 0.011 | 2000 | 80 | Bad | None |
| Example 7 | 0.053 ± 0.002 | 490 | 86 | Good | Slightly |

EXAMPLE 8

This Example is described with reference to FIG. 2. First, a desired masking ink containing graphite powder was prepared by mixing 0–4.3 g (0–30 wt % as calculated from the formula: [graphite powder/(masking ink+graphite powder)]×100) of graphite powder having an average particle size of 3 μm with 10 g of an ultraviolet-curing masking ink comprising an urethane type acrylate, an organic cure initiator and an organic solvent. A pattern with a line/space of 200 μm was formed on a silica coated sheet glass substrate 1 by screen printing with said masking ink. The printed pattern was irradiated with ultraviolet light from a high pressure mercury lamp (120 W/cm) at a conveyor speed of 0.5 m/min to cure the ink, thereby forming a masking pattern 5. This masking pattern was subjected to ozone cleaning. The situation at this point is shown in FIG. 2B. It was hardly possible to conduct screen printing on the substrate with a masking ink having a graphite powder content exceeding 30 wt %.

Then, a transparent conducting film forming composition prepared in the same way as in Example 1 was dip coated on the substrate 1 having said masking pattern to form a transparent conducting film forming composition layer 3. The situation at this point of the process is shown in FIG. 2C. The thus treated substrate was left at room temperature for 3 minutes, then dried at 60° C. for 3 minutes and calcined at 500° C. for one hour. This situation is shown in FIG. 2D. In the Figure, the masking pattern is shown in a state where the graphite powder is physically carried on the substrate as a consequence of formation of the transparent conducting film and thermal decomposition of the organic matter in the masking ink after curing. The residues of graphite powder and transparent conducting film were removed by ultrasonic cleaning (ultrasonic power 200 W) in water to obtain a patterned transparent conducting film 4 of this invention. The situation at this final stage of the process is shown in FIG. 2E.

FIG. 3 shows the relation between the amount of graphite powder added (its ratio to masking ink) and the pattern precision [determined from the formula: (pattern width of the formed transparent conducting film/200 μm)×100] of the formed masking pattern.

EXAMPLE 9

The procedure of Example 8 was repeated except that 2.5 g (20 wt % as calculated from Sn/(In+Sn)×100) of synthetic graphite (acetylene black) powder was mixed in place of the graphite powder used in Example 8.

EXAMPLE 10

The procedure of Example 8 was repeated except that 2.5 g (20 wt % as calculated from Sn/(In+Sn)×100) of activated carbon was used in place of graphite powder.

EXAMPLE 11

The procedure of Example 8 was repeated except that an epoxy type acrylate was used in place of an urethane type acrylate, that 2.5 g (20 wt % as calculated from Sn/(In+Sn)×100) of synthetic graphite powder was mixed, and that screen printing was conducted on a silica coated sheet glass substrate 1 with said masking ink, followed by drying at 60° C. for 10 minutes and heat treatment at 130° C. for 30 minutes for curing the ink.

EXAMPLE 12

The procedure of Example 8 was repeated except for using a masking ink comprising of an urethane type acrylate, an organic curing initiator and an organic solvent.

Table 2 shows the results of Examples 8–12. Pattern precision was expressed by the value determined from the formula: pattern width of the formed transparent conducting film/200 μm×100 (%).

TABLE 2

| | Pattern precision (%) | Resin thickness of masking ink (μm) | Transparent conducting film condition |
| --- | --- | --- | --- |
| Example 8 | 95% | 15 | Excellent |
| Example 9 | 90% | 20 | Better |
| Example 10 | 90% | 15 | Better |
| Example 11 | 90% | 15 | Excellent |
| Example 12 | 75% | 10 | Good |

What is claimed is:

1. A process for forming a patterned transparent conducting film comprising the steps of:
    (a) printing a masking ink on portions of a substrate at which no transparent conducting film forming composition is to be coated, said masking ink comprising at least a heat- or light-curing compound having a functional group,
    (b) curing the masking ink by heat or light so as to have, after curing, a higher decomposition temperature than that of the transparent conducting film forming composition,
    (c) coating the transparent conducting film forming composition on said substrate, said transparent conducting film forming composition comprising an indium compound, a tin compound, and a solvent, said tin compound being stannous oxalate,
    (d) subjecting said substrate to a heat treatment, and
    (e) removing residues of said masking ink and said transparent conducting film.

2. The process according to claim 1, wherein the masking ink contains at least one of epoxy acrylate, epoxy methacrylate, urethane acrylate and urethane methacrylate.

3. The process according to claim 1, wherein the masking ink contains carbon powder selected from the group consisting of natural graphite, synthetic graphite and amorphous carbon.

4. The process according to claim 3, wherein the carbon powder content in the masking ink is 30 wt % or less.

5. The process according to claim 1, wherein the solvent in the transparent conducting film forming composition is an organic solvent.

6. The process according to claim 1, wherein step (d) is carried out at a temperature above the decomposition of the transparent conducting film forming composition and the cured masking ink and below a substrate deforming temperature.

7. The process according to claim 1, wherein step (e) is carried out by physical means.

8. A process for forming a patterned transparent conducting film comprising the steps of:
    (a) printing a masking ink on portions of a substrate at which no transparent conducting film forming composition is to be coated, said masking ink comprising at least a heat-or light-curing compound having a functional group, (b) curing the masking ink by heat or light so as to have, after curing, a higher decomposition temperature than that of the transparent conducting film forming composition, (c) subjecting the printed substrate to ozone cleaning, (d) coating the transparent conducting film forming composition on said substrate, said transparent conducting film forming composition comprising an indium compound, a tin compound, and a solvent, said tin compound being stannous oxalate, (e) subjecting said substrate to a heat treatment, and (f) removing residues of said masking ink and said transparent conducting film.

9. The process according to claim 8, wherein step (b) comprises curing the masking ink by light and steps (b) and (c) are performed at the same time.

10. The process according to claim 8, wherein the masking ink contains at least one of epoxy acrylate, epoxy methacrylate, urethane acrylate and urethane methacrylate.

11. The process according to claim 8, wherein the masking ink contains carbon powder selected from the group consisting of natural graphite, synthetic graphite and amorphous carbon.

12. The process according to claim 11, wherein the carbon powder content in the masking ink is 30 wt % or less.

13. The process according to claim 8, wherein the solvent in the transparent conducting film forming composition is an organic solvent.

14. The process according to claim 8, wherein step (e) is carried out at a temperature above the decomposition of the transparent conducting film forming composition and the cured masking ink and below a substrate deforming temperature.

15. The process according to claim 8, wherein step (f) is carried out by physical means.

* * * * *